US006429442B1

(12) United States Patent
Tomita et al.

(10) Patent No.: US 6,429,442 B1
(45) Date of Patent: Aug. 6, 2002

(54) ION IMPLANTER

(75) Inventors: Hiroyuki Tomita; Kazuo Mera, both of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 102 days.

(21) Appl. No.: 09/657,584

(22) Filed: Sep. 8, 2000

(30) Foreign Application Priority Data

Sep. 17, 1999 (JP) .......................................... 11-263644

(51) Int. Cl.$^7$ ................................................ H01J 37/20
(52) U.S. Cl. ............................. 250/492.21; 250/492.2; 250/442.11; 250/440.11; 250/398
(58) Field of Search ........................ 250/492.21, 492.2, 250/442.11, 440.11, 398

(56) References Cited

U.S. PATENT DOCUMENTS 4,965,862 A * 10/1990 Freytsis et al. .......... 250/453.1
5,525,807 A * 6/1996 Hirokawa et al. ...... 250/492.21

FOREIGN PATENT DOCUMENTS

JP          8-329879        12/1996

\* cited by examiner

*Primary Examiner*—Bruce Anderson
*Assistant Examiner*—Nikita Wells
(74) *Attorney, Agent, or Firm*—Mattingly, Stanger & Malur, P.C.

(57) ABSTRACT

An ion implanter comprises an ion source and a wafer support device having a rotary disk that supports a plurality of wafers thereon and is rotated about its center axis, and capable of being swung alternately in opposite directions. An ion beam emitted by the ion source is projected on the wafers for ion implantation. The wafer support device is supported so that the center of gravity of the wafer support device lies below an axis about which the wafer support device is swung alternately in opposite directions and a component of the gravitational acceleration imparted to the wafer support device acts in the same direction as a force applied to the wafer support device to reverse the same.

2 Claims, 4 Drawing Sheets

ION IMPLANTER

BACKGROUND OF THE INVENTION

1. Field of the Invention

The present invention relates to an ion implanter and, more particularly, to an ion implanter provided with a to-and-fro wafer disk for supporting a wafer to be subjected to ion implantation.

2. Description of the Related Art

In a conventional ion implanter, a plurality of wafers are mounted in a circumferential arrangement on a rotary disk, the rotary disk is rotated and moved alternately in opposite directions to implant ions uniformly in all the wafers. A metronome type swinging mechanism for swinging the rotary disk alternately in opposite directions disclosed in JP-A No. Hei 8-329879 drives a reversible shaft disposed on a level below the center of gravity of the rotary disk by a motor or the like to swing the rotary disk alternately in opposite directions in a vertical plane. This metronome type swinging mechanism varies the moving speed of the rotary disk according to the position of the wafer subjected to ion implantation in order that ions are implanted uniformly in all the wafers.

An ion implanter, particularly, a SiMOX ion implanter that implants oxygen ions in silicon wafers is required to be capable of implanting oxygen ions in wafers in a highly accurate uniformity at a high throughput. When reversing the rotary disk in a to-and-fro motion, the direction and magnitude of the speed of the rotary disk change suddenly, and consequently, the speed of the rotary disk varies. Therefore, ion implantation is interrupted in a reversing range in which the moving direction of the rotary disk is reversed, whereby the ions can be implanted in the wafers supported on the rotary disk in a highly accurate uniformity only in a moving range in which the rotary disk moves at a predetermined speed. However, the interruption of ion implantation while the rotary disk is moving in the reversing range causes a time loss and reduces throughput.

Accordingly, it is an object of the present invention to provide an ion implanter capable of implanting ions in wafers in a highly accurate uniformity and to carry out an ion implantation process at a high throughput.

SUMMARY OF THE INVENTION

With the foregoing object in view, the present invention provides an ion implanter including an ion source, and a wafer support device having a rotary disk that supports a plurality of wafers thereon and is rotated about its center axis, and capable of being swung alternately in opposite directions, wherein an ion beam emitted by the ion source is projected on the wafers for ion implantation, the wafer support device is supported so that a component of the gravitational acceleration imparted to the wafer support device acts in the same direction as that of a force applied to the wafer support device to reverse the same.

Since the gravitational acceleration is imparted at all times to the wafer support device, the gravitational acceleration assists the force applied to the wafer support device when reversing the wafer support. Consequently, load that acts on the wafer support device when the wafer support device is reversed is reduced, time loss is reduced and the throughput of the ion implanter is improved.

According to the present invention, it is preferable that the center of gravity of the wafer support device should lie below an axis about which the wafer support device is swung alternately in opposite directions.

When the wafer support device is thus disposed, the component of the gravitational acceleration imparted to the wafer support device acts in the same direction as that of the force that is applied to the wafer support device to reverse the same.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Construction and operation of an ion implanter in a preferred embodiment according to the present invention will be described with reference to FIGS. 1 to 4.

The ion implanter will be described as applied to an ion implantation process for SiMOX with reference to FIGS. 1 and 2.

Figure 1:
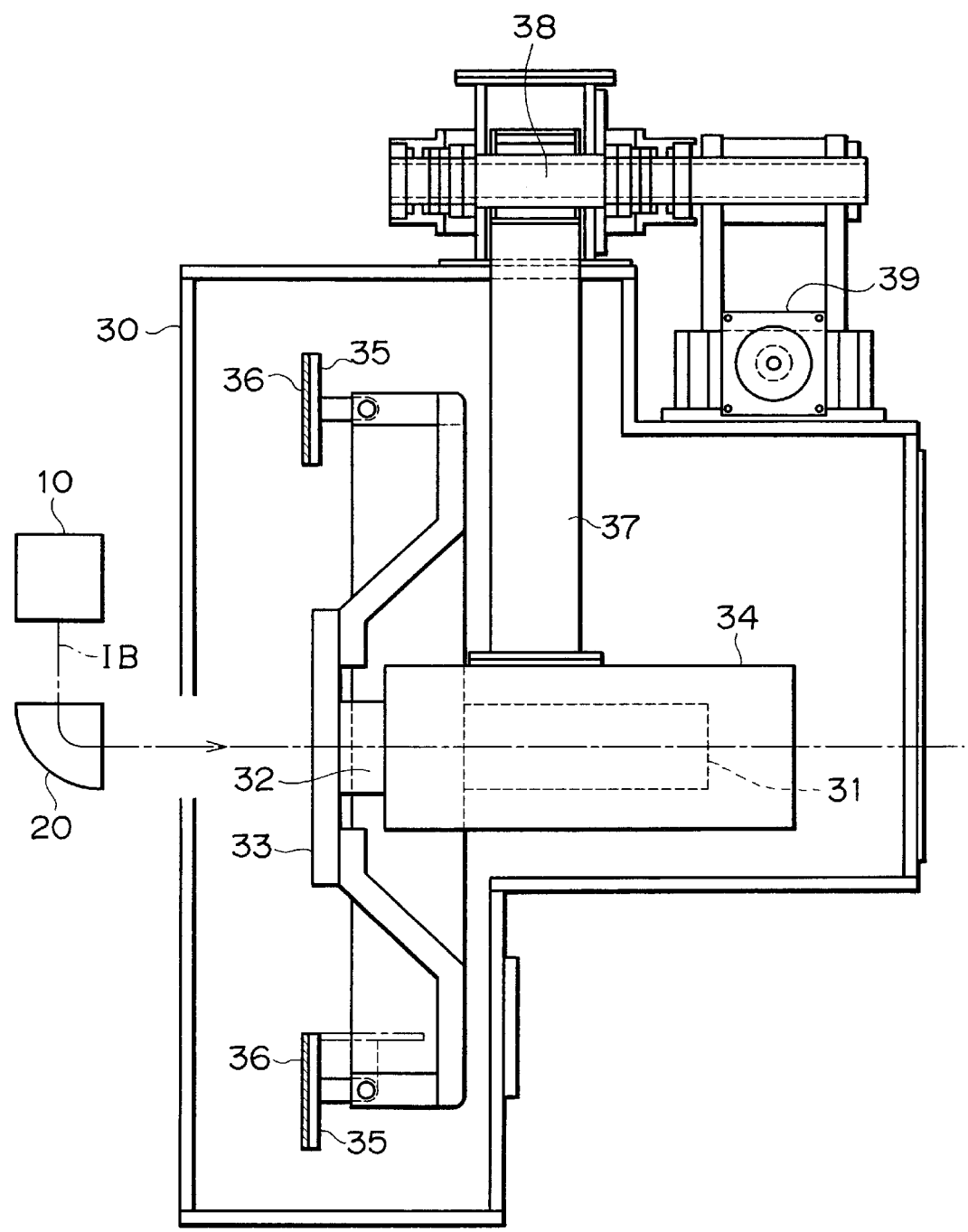
FIG. 1 is a side elevation of an ion implanter in a preferred embodiment according to the present invention.

Referring to FIG. 1, only ions of a predetermined mass are separated from an ion beam IB emitted by an ion source 10 by a mass separator 20 to provide an ion beam of ions of a single kind. The ion beam thus processed by the mass separator 20 is introduced into an end station 30. The end station 30 has a rotary disk 33 fixedly mounted on the output shaft 32 of a motor 31. The motor 31 is placed in a scan box 34. The rotary disk 33 is provided with a plurality of wafer holders 35. A plurality of wafers 36 are held on the wafer holders 35. The wafer holders 35 are arranged at equal angular intervals on the circular rotary disk 33. As shown in FIG. 2, the wafers 36 are arranged at equal angular intervals on the rotary disk 33. The rotary disk 33 mounted on the output shaft 32 of the motor 31 is driven for rotation in the direction of the arrow A by the motor 31.

The scan box 34 is attached to the lower end of a swing shaft 37 fixedly held on a shaft 38. The shaft 38 is turned by a scanning motor 39 in which the direction of rotation is reversible. The output shaft of the scanning motor 39 is rotated alternately in opposite directions to turn the shaft 38 alternately in opposite directions and to move the rotating rotary disk 33 holding the wafers 36 alternately in opposite directions as shown in FIG. 2.

The axis of rotation of the shaft 38 that swings the rotary disk 33 alternately in opposite directions extends on a level above the center of gravity of the rotary disk 33 (position of the output shaft 32). Therefore, the rotary disk 33 swings about the axis of the shaft 38 alternately in opposite directions indicated by the arrows B like a pendulum.

Figure 2:
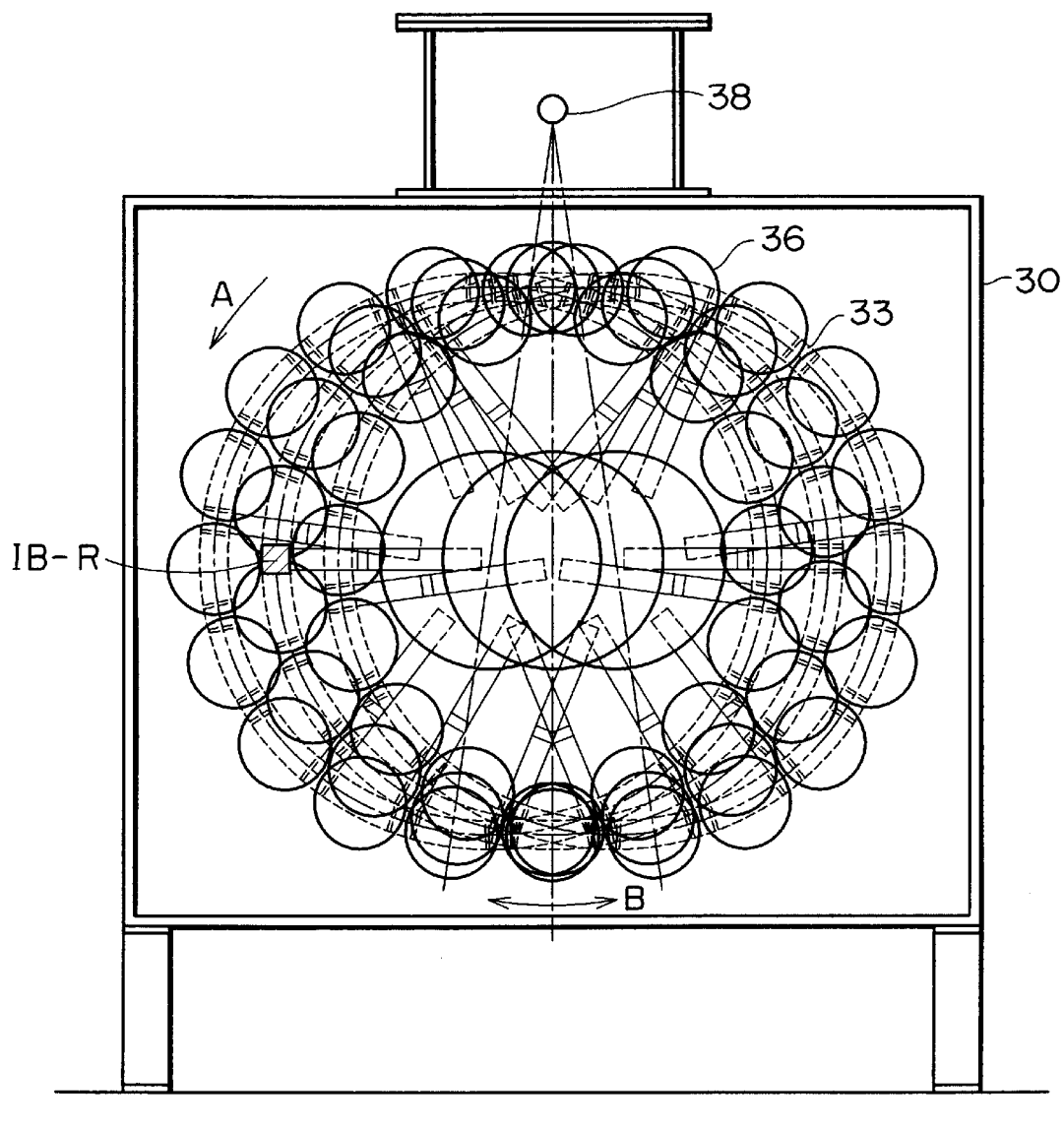
FIG. 2 is a front elevation of the ion implanter shown in FIG. 1.

As shown in FIG. 2, the ion beam IB-R introduced into the end station 30 has a substantially rectangular cross section. The ion beam IB-R is able to implant ions in the entire surfaces of all the wafers 36 when the wafer holders 35 of the rotary disk 33 holding the wafers 36 are revolved in the direction of the arrow A and the rotary disk 33 is swung alternately in opposite directions indicated by the arrows B. Since the wafer holders 35 holding the wafers 36 are attached to the rotary disk 33 in a circumferential arrangement, the velocity (linear velocity) relative to the ion beam IB-R of a portion of the wafer 36 nearer to the center of rotation of the rotary disk 33 is higher than that of a portion of the wafer 36 farther from the center of rotation of the rotary disk 33. Therefore, if the rotary disk 33 is swung in the directions of the arrows B at a fixed speed, the dose of the portion nearer to the center of rotation of the rotary disk 33 is smaller than that of the portion farther from the center of rotation of the rotary disk 33. Therefore, ions cannot be implanted in the wafers 36 in a uniform dose distribution. The dose uniformity of the wafers 36 can be improved by reducing the moving speed of the rotary disk 33 when the portion of the wafer 36 nearer to the center of rotation of the rotary disk 33 crosses the ion beam IB-R below the moving speed of the same when the portion of the wafer 36 farther from the center of rotation of the rotary disk 33 crosses the ion beam IB-R. Therefore, a stepping motor is used as the scanning motor 39 and the value of a speed command given to the scanning motor 39 is varied to control the speed of the to-and-from motion of the rotary disk 33.

Figure 3:
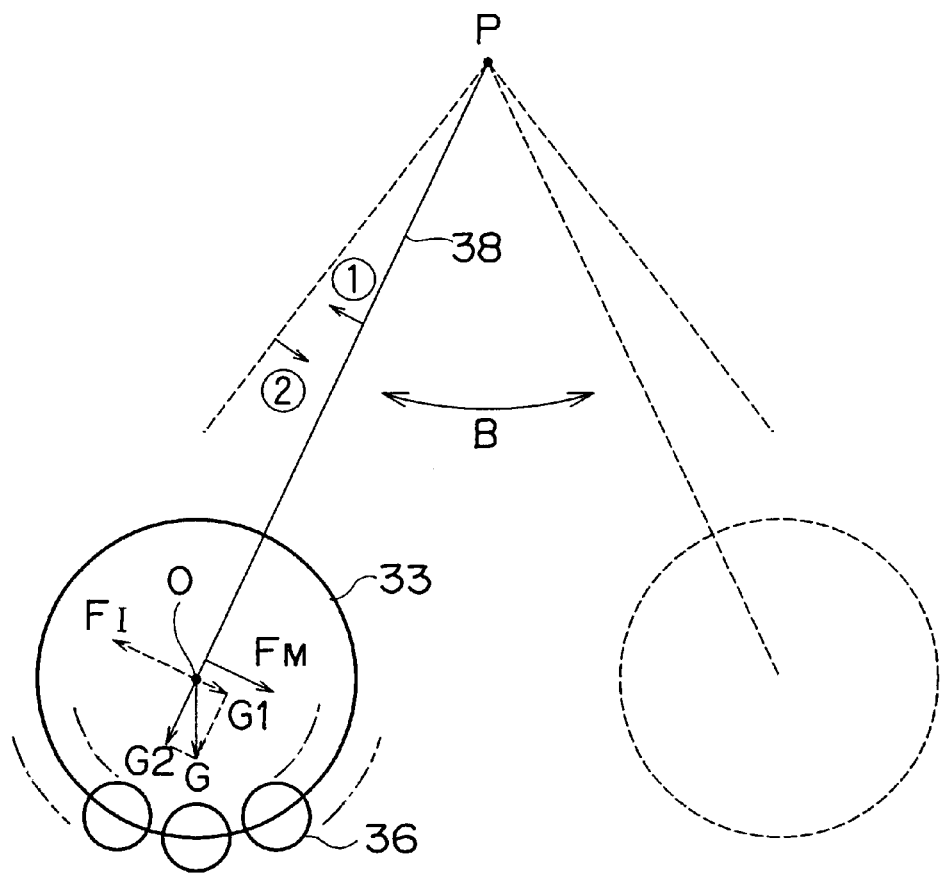
FIG. 3 is a typical view of assistance in explaining the to-and-fro motion of a rotary disk included in the ion implanter shown in FIG. 1 and holding wafers.
Figure 4:
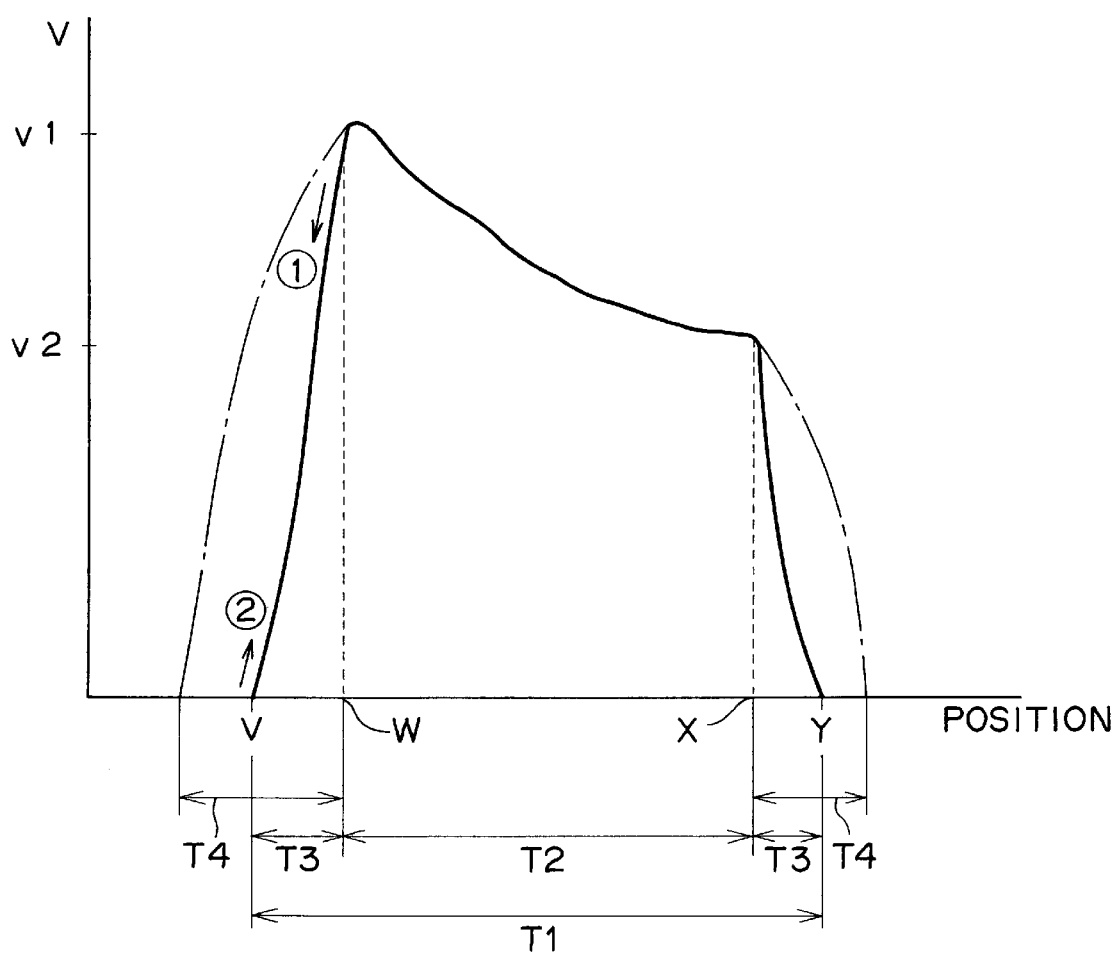
FIG. 4 is a graph of assistance in explaining the variation of the speed of the rotary disk holding wafers when the rotary disk is swung alternately in opposite directions.

The variation of the speed of the to-and-from motion of the rotary disk 33 will be explained with reference to FIGS. 3 and 4. Referring to FIG. 3, the rotary disk 33 holding the wafers 36 is suspended by the shaft 37 from the shaft 38. The rotary disk 33 is swung alternately in opposite directions indicated by the arrows B about the axis P of rotation of the shaft 38. In FIG. 4, the position of the center O of the rotary disk 33 is measured on the horizontal axis and the speed v of the center O of the rotary disk 33 is measured on the vertical axis. The center O of the rotary disk 33 moves from a position V through positions W and X to a position Y and then moves from the position Y through the positions X and W to the position V. The movement of the rotary disk 33 is controlled so that a speed v1 at the position W is higher than a speed v2 at the position X, and the speed of the rotary disk 33 varies continuously from the speed v1 to the speed v2, and from the speed v2 to the speed v1. The ion beam IB-R is projected on the wafers 36 while the rotary disk 33 is moving between the positions W and X.

FIG. 3 shows the rotary disk 33 at the position W shown in FIG. 4. The shaft 38 is stopped upon the arrival of the center O of the rotary disk 33 at the position W. When the scanning motor 39 applies a force FM through the shaft 38 to the rotary disk 33 to reverse the rotary disk 33, the rotary disk 33 is moved beyond the position W in the direction of the arrow ① by an inertial force F1. Suppose that the center of gravity of the rotary disk 33 coincides with the center O of the rotary disk 33 and the gravity is denoted by G. Then, a component G1 of the gravity G acts on the center O in the same direction as the force FM. When a condition: F1<FM+G1 is satisfied, the movement of the rotary disk 33 in the direction of the arrow ① is stopped. FIG. 4 shows that the foregoing condition is satisfied upon the arrival of the center O of the rotary disk 33 at the position V.

On the other hand, in the conventional ion implanter, in which the rotary disk is moved alternately in opposite directions by a motor or the like about an axis extending on a level below that of the center of gravity of the rotary disk, a component of the gravitational acceleration imparted to the rotary disk acts in the same direction as the inertial force. Therefore, the rotary disk stops when a condition: F1+G1<FM is satisfied. The variation of the speed of the rotary disk before the condition is satisfied is indicated by a chain line in FIG. 4. When the ion implanter of the present invention uses the force FM equal to that used by the prior art ion implanter, the rotary disk 33 can be stopped earlier than the rotary disk of the prior art ion implanter because the component G1 of the gravity G assists the force FM in stopping the rotary disk 33.

The rotary disk 33 of the ion implanter embodying the present invention moves beyond the position W and stops at the position V in a time T3, whereas the rotary disk of the prior art ion implanter takes a time T4 longer than the time T3 before stopping after passing the position V. The rotary disk 33 of the ion implanter embodying the present invention takes a time T1=T2+2×T3 to move from the position V to the position Y. During the time 2×T3, the ion beam is not projected and the time 2×T3 is a time loss. Therefore, the time loss ratio is: 2×T3/(T2+2×T3). In the operation of the prior art ion implanter, time loss is 2×T4 and hence the time loss ratio is: 2×T4/(T2+2×T4). Thus, the time loss in the ion implanter embodying the present invention is less than that in the prior art ion implanter.

Suppose that twenty 200 mm diameter wafers are held on the rotary disk and the ion implantation time T2 is 1.5 s, T3 is 0.25 s and T4 is 0.5 s. Then, the time loss ratio in the operation of the ion implanter embodying the present invention is 25% (=0.5/2.0) whereas the time loss ratio in the prior art ion implanter is 40% (=1.0/2.5).

Large wafers have been widely used in recent years. When processing, for example, 300 mm diameter wafers for ion implantation, the ion implantation time T2=2.25 s and the time loss T4=0.5 and the time loss ratio=31% (=1.0/3.25) when the prior art ion implanter is used, and the ion implantation time T2=2.25 s, the time loss T3=0.25 s and the time loss ratio=18% (=0.5/2.75) when the ion implanter embodying the present invention is used.

When starting reversing the rotary disk 33 after stopping the same, i.e., when starting moving the rotary disk 33 from the position V in the direction of the arrow ②, the scanning motor 39 is controlled so as to apply a force FM to the rotary disk 33, both the force FM and a component G1 of the gravitational acceleration G acts on the center of the rotary disk 33, so that the rotary disk 33 can be accelerated to the speed v1 at which the rotary disk 33 must be moved for ion implantation in a short time.

As mentioned above, since the axis of rotation of the shaft 38 about which the rotary disk 33 swings alternately in opposite directions like a pendulum extends on a level above the center of gravity of the rotary disk 33, the gravitational acceleration imparted to the rotary disk 33 assists the driving force of the scanning motor 39 in swinging the rotary disk 33, so that the time loss can be reduced and the throughput of the ion implanter can be improved. The speed of swinging motion of the rotary disk 33 is thus controlled to improve the uniformity of dose distribution and the throughput can be improved.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. An ion implanter comprising:
    an ion source; and
    a wafer support device having a rotary disk that supports a plurality of wafers thereon and is rotated about its center axis, and capable of being swung alternately in opposite directions;

wherein an ion beam emitted by the ion source is projected on the wafers for ion implantation, the wafer support device is supported so that a component of the gravitational acceleration imparted to the wafer support device acts in the same direction as a force applied to the wafer support device to reverse the same.

2. The ion implanter according to claim 1, wherein the center of gravity of the wafer support device lies below an axis about which the wafer support device is swung alternately in opposite directions.

* * * * *